United States Patent
Laaksonen et al.

(10) Patent No.: US 6,582,973 B1
(45) Date of Patent: Jun. 24, 2003

(54) METHOD FOR CONTROLLING A SEMICONDUCTOR MANUFACTURING PROCESS

(75) Inventors: Reima Tapani Laaksonen, Dallas, TX (US); Padmanabh Krishnagiri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/117,726

(22) Filed: Apr. 5, 2002

(51) Int. Cl.[7] .............................................. H01L 21/00
(52) U.S. Cl. ............................................. 438/5; 438/14
(58) Field of Search ............................... 438/4, 5, 6, 14, 438/15, 16, 17

(56) References Cited

U.S. PATENT DOCUMENTS

| | | | | |
|---|---|---|---|---|
| 5,851,842 A | * | 12/1998 | Katsumata et al. | 438/9 |
| 5,885,472 A | * | 3/1999 | Miyazaki et al. | 216/60 |
| 6,054,333 A | * | 4/2000 | Bensaoula | 438/9 |
| 6,060,329 A | * | 5/2000 | Kamata et al. | 438/9 |
| 6,258,610 B1 | * | 7/2001 | Blatchford et al. | 438/14 |
| 6,468,814 B1 | * | 10/2002 | Frees et al. | 438/14 |

\* cited by examiner

*Primary Examiner*—John F. Niebling
*Assistant Examiner*—Olivia Luk
(74) *Attorney, Agent, or Firm*—Yingsheng Tung; Wade James Brady, III; Frederick J. Telecky, Jr.

(57) ABSTRACT

A method for dynamically controlling a semiconductor manufacturing process for producing a semiconductor component includes performing a plurality of process segments. Each respective process segment is performed for a respective processing interval. The method includes the steps of: (a) determining a relationship among respective process intervals for at least two particular process segments of the plurality of process segments; (b) determining a first respective process interval required for a first particular process segment to effect a desired result in the semiconductor component; and (c) using the relationship to establish the respective process interval required for at least one selected particular process segment in order to fix the respective process interval for a controlled process segment other than the at least one selected particular process segment.

13 Claims, 7 Drawing Sheets

METHOD FOR CONTROLLING A SEMICONDUCTOR MANUFACTURING PROCESS

BACKGROUND OF THE INVENTION

The present invention is directed to manufacturing of semiconductor devices, and especially to dynamically controlling an etch process to improve product quality and yield as well as to improve efficiency of the process overall.

A typical etch process for a semiconductor device includes several etch process segments, or steps: (1) a hard mask etch (HM), (2) a hard mask over etch (HMO), an ASH resist away step, a polysilicon breakthrough (PBT), a polysilicon main etch step (PME), a polysilicon end point step (PEP) and a polysilicon over etch step (POE). The hardmask over etch step (HMO) is typically used to control the critical dimension (CD) of the gate of a semiconductor device, such as a transistor. The hardmask over etch (HMO) processing time, that is the time during which the semiconductor device is subjected to the HMO etch bath, may vary from lot to lot among various batches of processed material. Because the HMO step time varies from lot to lot due to the variations in the printed lithographic CD and because the HMO step consumes polysilicon material, the thickness of polysilicon material present for subsequent etch process segments also varies from lot to lot. As a consequence there is a risk that at some locations on the wafer the oxide under the polysilicon material will be exposed for a long period of time during the PEP step or even in some cases during the PME etch step. In such situations punchthrough or microtrenching through the oxide into the underlying silicon substrate can occur near the transistor gate. That is, because of the variance from lot to lot in processing time the HMO process usually consumes polysilicon material, and the thickness of polysilicon material present for subsequent etch process segments is sometimes less than planned for when the etch recipe is established. One of the subsequent etch process segments, polysilicon main etch (PME) step, is not reliably selective. As a consequence there is a risk that oxide material under the polysilicon material will be etched by the PME step. In extreme occasions of such oxide etching microtrenching occurs near the transistor gate. The microtrenching may be reduced or eliminated by manually reducing the processing interval for the PME step. However, such a manual adjustment process is not useful for an automated system of the sort desired for achieving high throughput in semiconductor device manufacturing.

It would be desirable to be able to maintain the polysilicon end point (PEP) processing interval as constant and as short as possible. In particular it would be desirable to provide a method for controlling a process for manufacturing semiconductor devices that assures a short and substantially constant processing interval for a polysilicon end point (PEP) etching segment.

Maintaining polysilicon end point (PEP) processing interval constant at a short interval provides several advantages. In particular, by controlling the PEP etch processing interval one can significantly reduce the occurrence of punchthrough. Further, PEP etch is usually carried out in a condition in which contaminants tend to build up within the chamber in which the etch is carried out. Periodic chamber cleaning is therefore required. Such cleaning operations interfere with production and significantly reduce the yield and throughput of a manufacturing process. Reducing PEP etch processing intervals to a minimum serves to reduce times of contaminant build up and therefore increases intervals between required cleaning of the chamber and tools, improving the process throughput.

Another consideration that makes PEP processing interval reduction advantageous is the fact that this step affects differently n-material and p-material used in fabricating n-type and p-type transistors. The PEP step, unlike the preceeding steps, does not contain fluorine (F), which does not differentiate between the n-type and p-type material. The CDs are set-up by the preceeding steps, but the PEP step will have an influence on the CDs. Therefore, the PEP step should be kept short and fixed to minimize the difference between the n-type and p-type transistor CDs.

SUMMARY OF THE INVENTION

A method for dynamically controlling a semiconductor manufacturing process for producing a semiconductor component includes performing a plurality of process segments. Each respective process segment is performed for a respective processing interval. The method includes the steps of: (a) determining a relationship among respective process intervals for at least two particular process segments of the plurality of process segments; (b) determining a first respective process interval required for a first particular process segment to effect a desired result in the semiconductor component; and (c) using the relationship to establish the respective process interval required for at least one selected particular process segment in order to fix the respective process interval for a controlled process segment other than the at least one selected particular process segment.

It is, therefore, an object of the present invention to provide a method for controlling a process for manufacturing semiconductor devices that assures a short and substantially constant processing interval for a polysilicon end point (PEP) etching segment.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
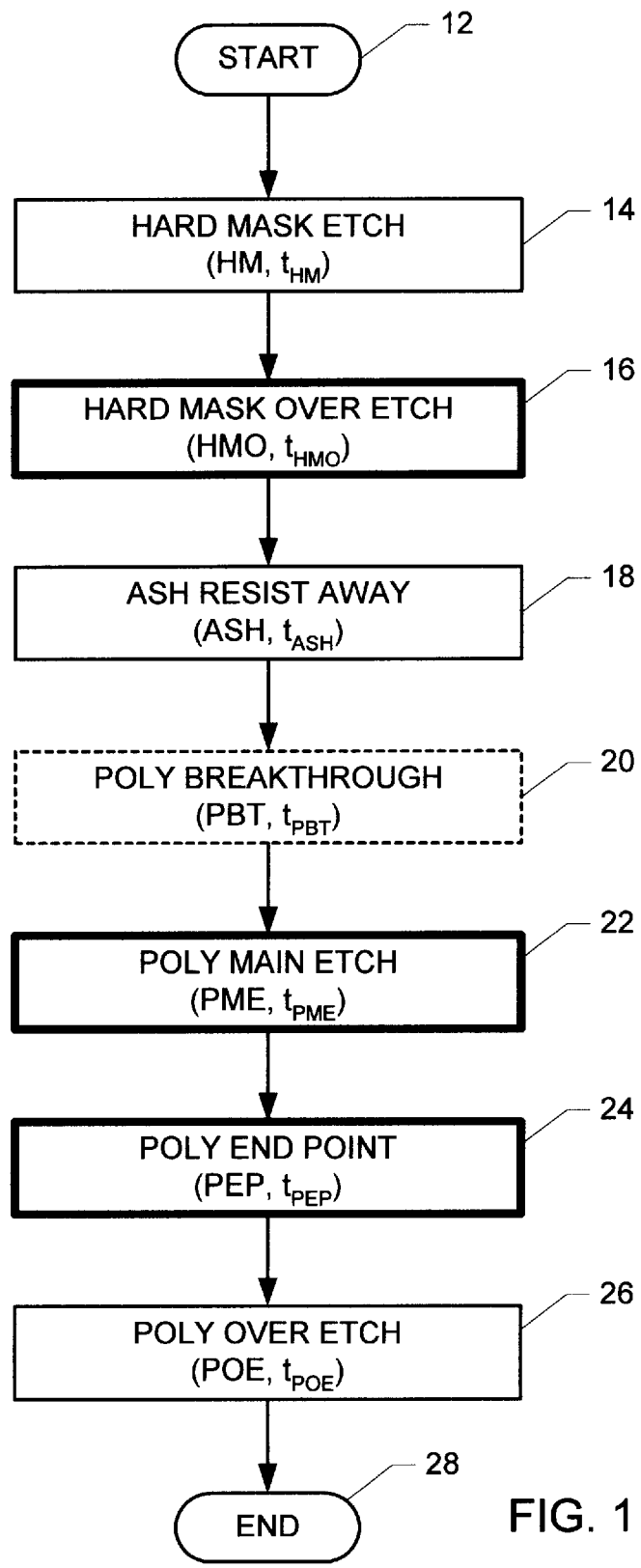
FIG. 1 is a flow diagram illustrating a representative etch process useful in manufacturing a semiconductor device.

FIG. 1 is a flow diagram illustrating a representative etch process useful in manufacturing a semiconductor device. In FIG. 1, an etch process 10 begins at a start locus 12 and proceeds to a hard mask etch (HM) process, as indicated by a block 14. After a HM processing time $t_{HM}$, etch process 10 proceeds with a hard mask over etch (HMO) process, as indicated by a block 16. The HMO step allows the achievement of a desired critical dimension (CD), such as for a gate structure. After an HMO processing time $t_{HMO}$, etch process 10 proceeds to an ASH process, as indicated by a block 18. The ASH process is essentially a burning or oxidation process for removing photoresist material from the semiconductor device being manufactured. After an ASH processing time $t_{ASH}$, etch process 10 proceeds with a polysilicon breakthrough (PBT) process, as indicated by a block 20. The PBT process may be optionally omitted from etch process 10, as indicated by block 20 being illustrated using dotted lines. The PBT process is employed when needed to remove any oxide that may have formed on exposed silicon layers during the ASH process. After a PBT processing time $t_{PBT}$, etch process 10 proceeds with a polysilicon main etch (PME) process, as indicated by a block 22. The PME process involves a relatively aggressive chemistry and serves to remove most of the exposed polysilicon material that may remain on the substrate upon which the semiconductor device is formed. After a PME processing time $t_{PME}$, etch process 10 proceeds with a polysilicon end point (PEP) process, as indicated by a block 24. The PEP process involves less aggressive or gentler chemistry than is used in the PME process and carries on the removal of exposed polysilicon material that was begun by the PME process. After a PEP processing time $t_{PEP}$, etch process 10 proceeds with a polysilicon over etch (POE) process, as indicated by a block 26. The POE process also involves a relatively gentle chemistry for completing removal of exposed polysilicon material left on the wafer, or substrate, of the semiconductor device being manufactured. After a POE processing time $t_{POE}$, etch process 10 is complete, as indicated by etch process 10 proceeding to an end locus 28.

Figure 2:
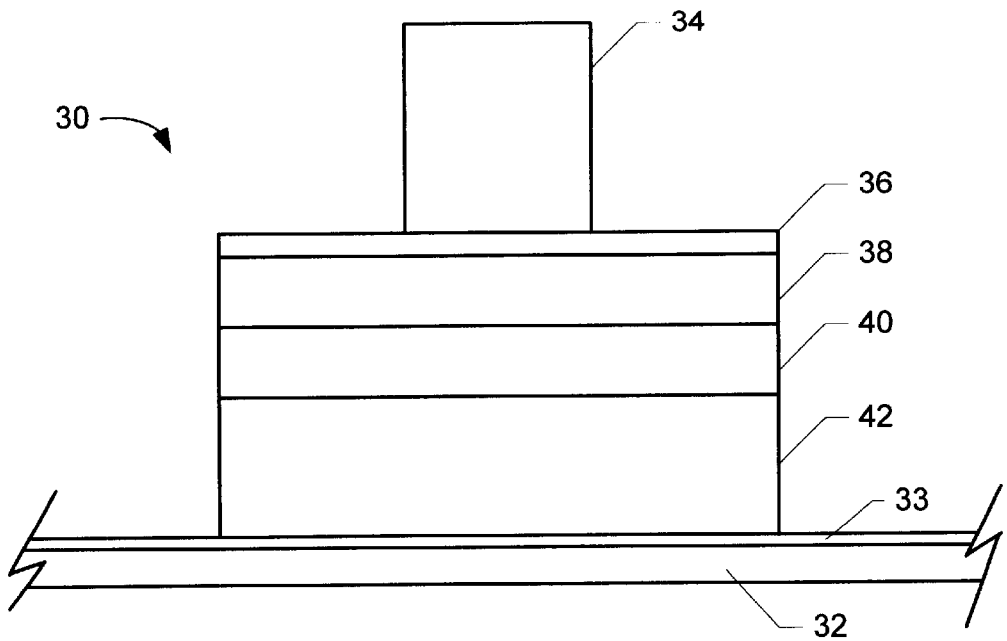
FIG. 2 is a schematic elevation view of a semiconductor device in a first interim structure during its manufacture.

FIG. 2 is a schematic elevation view of a semiconductor device in a first interim structure during its manufacture. In FIG. 2, a first interim semiconductor device 30 is formed upon a substrate 32. First interim semiconductor device 30 has been patterned upon substrate 32 by a photoresist material 34 shading selected portions of underlying layers that include a silicon oxide material layer 36 under photoresist material 34 and an SiON layer 38 under silicon oxide layer 36. First interim semiconductor device 30 further includes an SRN layer 40 under SiON layer 38 and a polysilicon layer 42 under SRN layer 40. Polysilicon layer 42 is deposited on the top of an oxide layer 33, which is located on the top of substrate 32.

Figure 3:
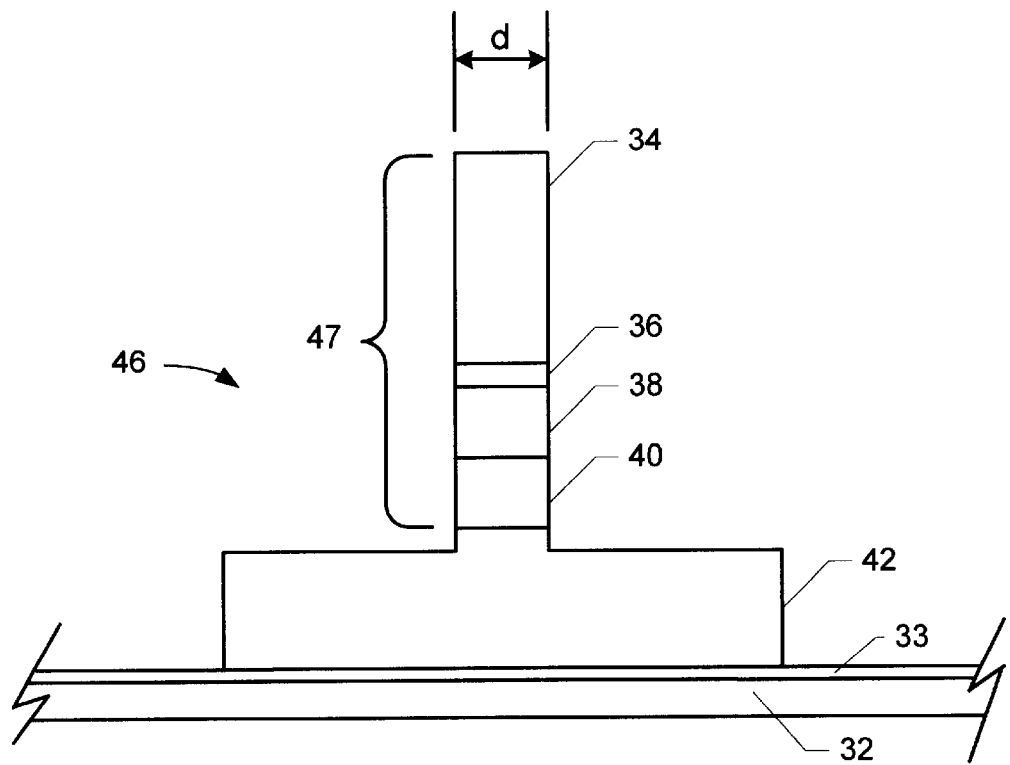
FIG. 3 is a schematic elevation view of a semiconductor device in a second interim structure during its manufacture.

FIG. 3 is a schematic elevation view of a semiconductor device in a second interim structure during its manufacture. In FIG. 3, a second interim semiconductor device 46 is formed upon substrate 32. Second interim semiconductor device 46 has a layered structure similar to the structure of first interim semiconductor device 30 (FIG. 2) with a photoresist layer 34, a silicon oxide material layer 36, an SiON layer 38, an SRN layer 40 and a polysilicon layer 42 on top of an oxide layer 33 above a substrate 32. The structure of second interim semiconductor device 46 is present in the practice of etch process 10 (FIG. 1) following completion of the hard mask etch (HMO) step (block 16; FIG. 1). The HMO etch step effects reduction of the width of a gate area 47 that includes photoresist layer 34, silicon oxide layer 36, SiON layer 38 and SRN layer 40. The width d of gate area 47 is a critical dimension (CD) of the semiconductor device which is to be fashioned from second interim semiconductor device 46.

Figure 4:
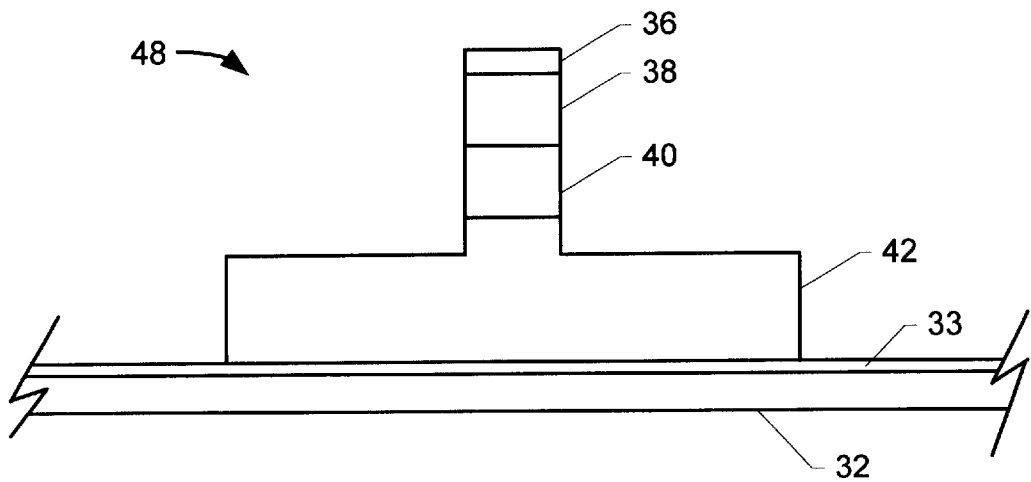
FIG. 4 is a schematic elevation view of a semiconductor device in a third interim structure during its manufacture.

FIG. 4 is a schematic elevation view of a semiconductor device in a third interim structure during its manufacture. In FIG. 4, a third interim semiconductor device 48 is formed upon substrate 32. Third interim semiconductor device 48 has a layered structure similar to the structure of second interim semiconductor device 46 (FIG. 3) with a silicon oxide material layer 36, an SiON layer 38, an SRN layer 40 and a polysilicon layer 42 on a oxide layer 33 above a substrate layer 32. The structure of third interim semiconductor device 48 is present in the practice of etch process 10 (FIG. 1) following completion of the ASH resist away (ASH) step (block 18; FIG. 1). The ASH etch step effects removal of photoresist material 34 (FIG. 3) and the PBT etch step effects removal of oxides that may form on third interim semiconductor device 48 during the ASH etch process.

Figure 5:
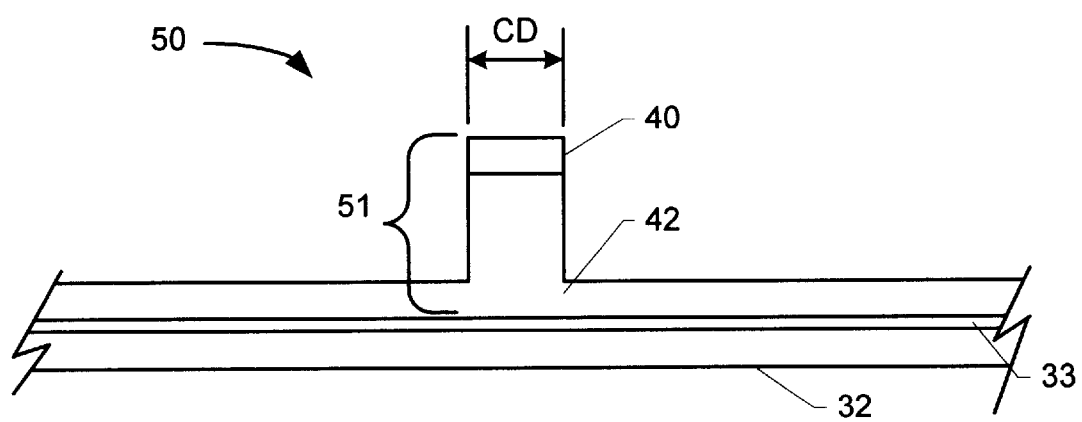
FIG. 5 is a schematic elevation view of a semiconductor device in a fourth interim structure during its manufacture.

FIG. 5 is a schematic elevation view of a semiconductor device in a fourth interim structure during its manufacture. In FIG. 5, a fourth interim semiconductor device 50 is formed upon substrate 32. Fourth interim semiconductor device 50 has a layered structure similar to the structure of third interim semiconductor device 48 (FIG. 4) with an SRN layer 40 and a polysilicon layer 42 on top of an oxide layer 33 above a substrate 32. The structure of fourth interim semiconductor device 50 is present in the practice of etch process 10 (FIG. 1) following completion of the polysilicon main etch (PME) step (block 22; FIG. 1). The PME etch step effects removal of silicon oxide layer 36 and SiON layer 38 and part of the SRN layer 40 (FIG. 4). Remaining gate structure 51 includes SRN layer 40 and polysilicon layer 42 on top of oxide layer 33 above substrate 32.

Figure 6:
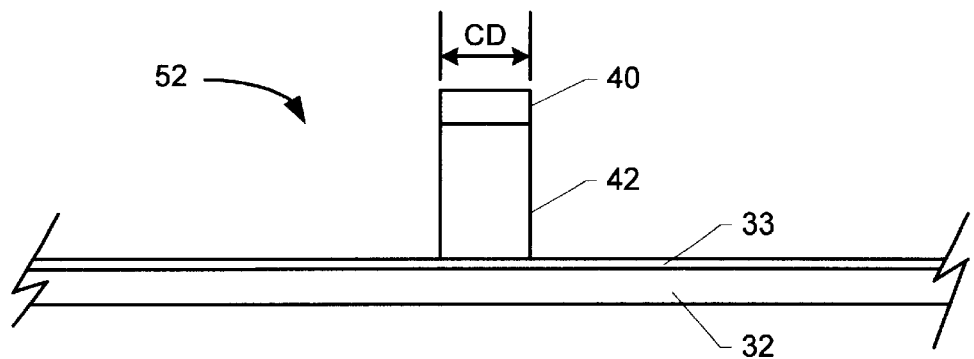
FIG. 6 is a schematic elevation view of a semiconductor device in a fifth interim structure during its manufacture.

FIG. 6 is a schematic elevation view of a semiconductor device in a fifth interim structure during its manufacture. In FIG. 6, a fifth interim semiconductor device 52 is formed upon substrate 32. Fifth interim semiconductor device 52 is substantially comprised of polysilicon layer 42 on top of oxide layer 33 above substrate 32, with the width of polysilicon layer 42 established substantially at critical dimension CD. The structure of fifth interim semiconductor device 52 is present in the practice of etch process 10 (FIG. 1) following completion of the polysilicon end point etch (PEP) step (block 24; FIG. 1) and the polysilicon over etch (POE) step (block 26; FIG. 1). The PEP etch step employs a less aggressive, gentler chemistry than the PME step to finish removing polysilicon layer 42 (FIG. 4). The POE step ensures that no polysilicon material remains on oxide layer 33 on top of substrate 32 (i.e., the wafer bearing the semiconductor device being manufactured) other than within the critical dimension area occupied by polysilicon layer 42. The PEP and POE etch steps also affect the width of polysilicon layer 42 to establish the width of remaining gate structure 51. Completion of POE etch step (block 26; FIG. 1) ends etch process 10 (FIG. 1). The remaining SRN layer 40 is removed in a subsequent clean process.

Figure 7:
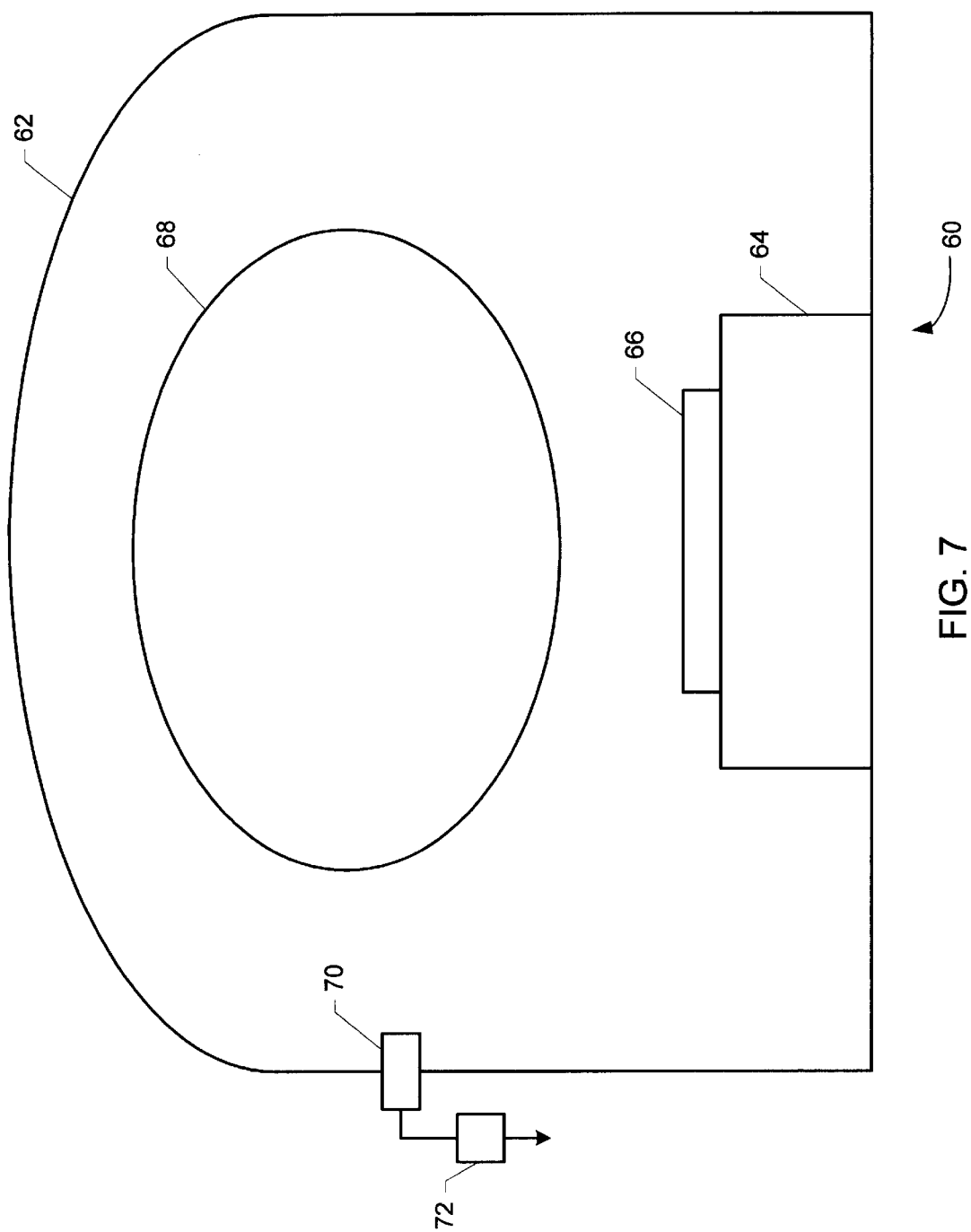
FIG. 7 is a schematic view of a typical chamber arrangement employed in manufacturing semiconductor devices.

FIG. 7 is a schematic view of a typical chamber arrangement employed in manufacturing semiconductor devices. In FIG. 7, a chamber arrangement 60 includes a chamber housing 62 containing a wafer chuck 64. Wafer chuck 64 holds a wafer 66 for processing within chamber 62. Semiconductor devices of the sort described in connection with FIGS. 1–6 (not shown in detail in FIG. 7) are patterned upon wafer 66. A plasma (represented in FIG. 7 by cloud 68) is maintained within chamber 62 for effecting processing steps of various sorts upon wafer 66. For example, plasma 68 may include, at various times, hydrogen bromine, fluorine or chlorine gases. Some of the processes that occur within chamber 62 emit light from within plasma 68 or affect light transmitted through plasma 68. A light detector 70 detects light from chamber 62 (i.e., light generated within plasma 68 or light transmitted through plasma 68) and provides an indication of that detected light via an interface unit 72 to another unit (not shown in FIG. 7) for evaluation to indicate the condition of wafer 66 during certain processing steps.

Figure 8:
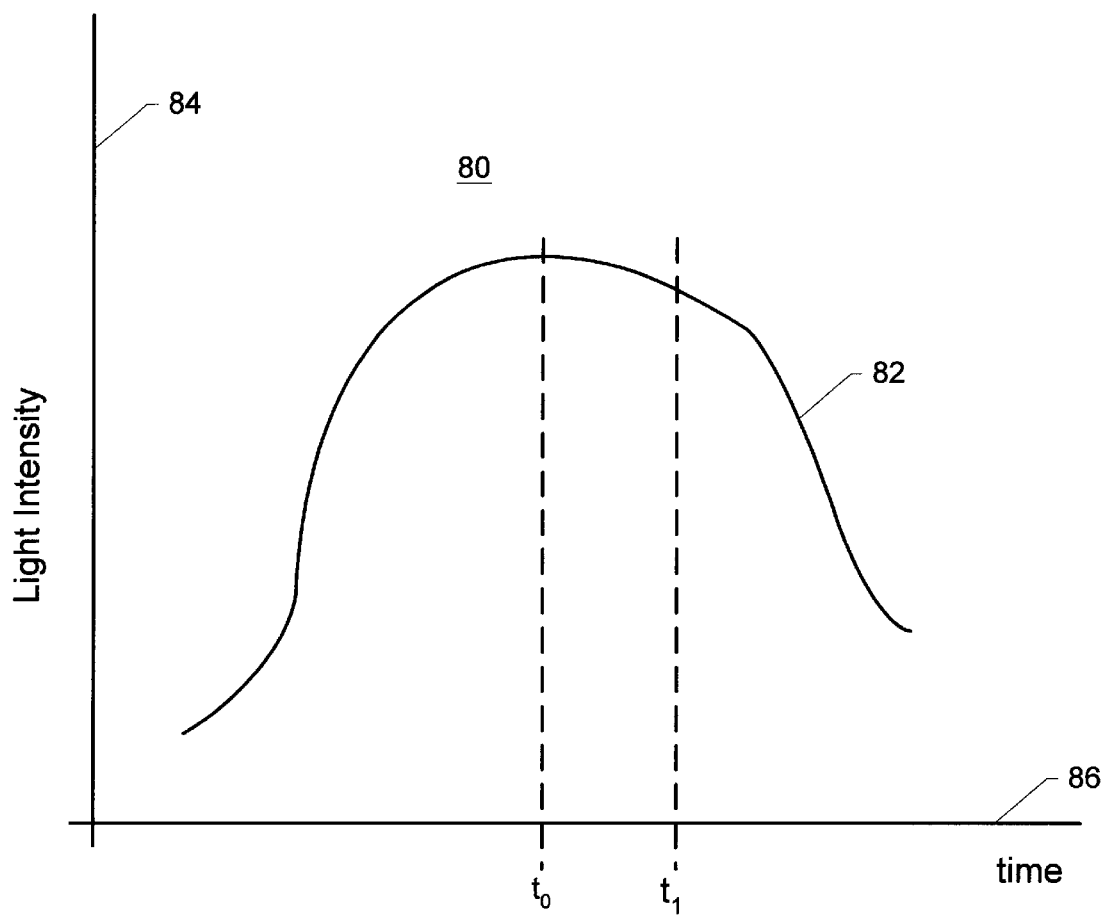
FIG. 8 is a graphic plot illustrating a relation between optical endpoint signal (OES) and time.

FIG. 8 is a graphic plot illustrating a relation between optical end point signal (OES) and time. In FIG. 8, a graphic plot 80 presents a curve 82 indicating light intensity, plotted on an axis 84, as a function of time, plotted on an axis 86. Curve 82 peaks at a time $t_0$. Curve 82 is representative of light intensity observed from a processing chamber (e.g., chamber 62; FIG. 7) while processing a semiconductor device. The intensity of light from a processing chamber indicates the condition of the semiconductor device being treated in the chamber. At a time $t_1$, sometime after light intensity peaks at time $t_0$, curve 82 indicates an optimal set of conditions (based upon experience of operators in processing semiconductor devices) for terminating a particular etch step within an etch process (e.g., etch process 10; FIG. 1). Such an optimal set of conditions is often referred to as being indicated by an optical endpoint signal (OES).

Figure 9:
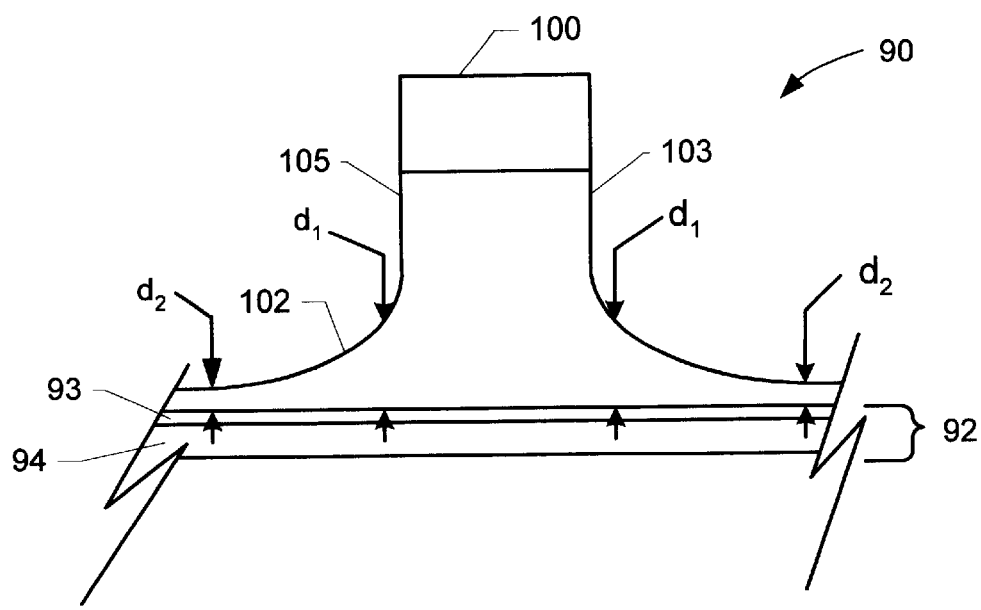
FIG. 9 is a schematic elevation view of a semiconductor device in an interim structure during its manufacture showing detail regarding the structure of polysilicon in the device.

FIG. 9 is a schematic elevation view of a semiconductor device in an interim structure during its manufacture showing detail regarding the structure of polysilicon in the device. In FIG. 9, an interim semiconductor device 90 at a manufacturing stage similar to the illustration provided in FIG. 5. Interim semiconductor device 90 is formed upon substrate 92. Substrate 92 includes a first layer 94 substantially manufactured of silicon and an oxide layer 93 on top of first layer 94. Interim semiconductor device 90 has an SRN layer 100 and a polysilicon layer 102 on oxide layer 93 on top of substrate 92. The structure of interim semiconductor device 90 is present in the practice of etch process 10 (FIG. 1) following completion of the polysilicon main etch (PME) step (block 22; FIG. 1). Polysilicon layer 102 is represented less schematically and more realistically in FIG. 9 than polysilicon layer 42 was illustrated in FIG. 5. That is, polysilicon layer 102 is represented as having a tapered junction with substrate 92. The tapered junction varies in thickness from a thickness $d_1$ near a substantially vertical walls 103, 105 of polysilicon layer 102, to a lesser thickness $d_2$ at loci distal from vertical walls 103, 105. The point is that processing using the various etch steps (e.g., etch steps in etch process 10; FIG. 1) must take into account the lesser thickness $d_2$ distal from vertical walls 103, 105 in ensuring that proper amounts of appropriate materials are removed, or etched away during the various etch steps.

Figure 10:
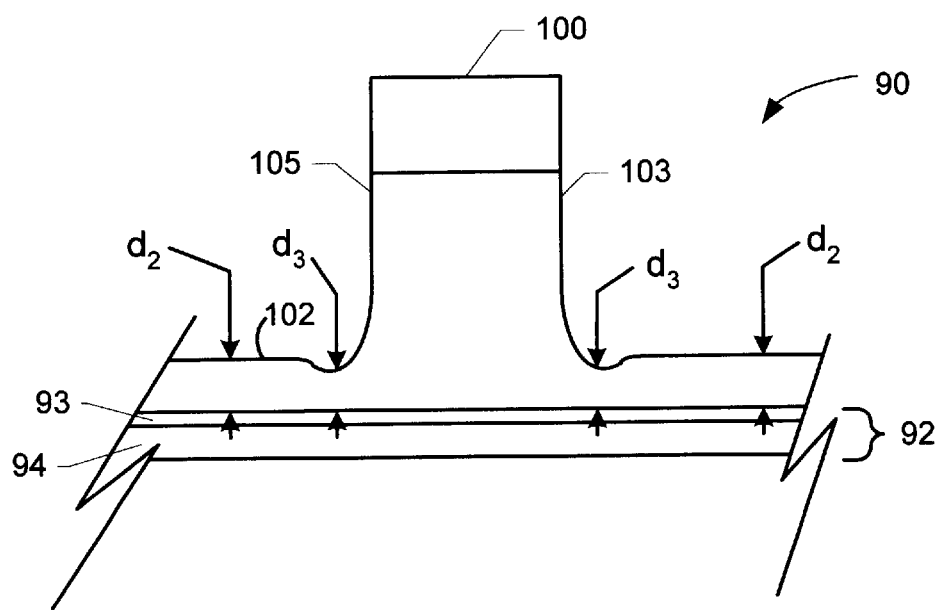
FIG. 10 is a schematic elevation view of a semiconductor device in an interim structure during its manufacture showing detail regarding the occurrence of punchthrough during manufacture.

FIG. 10 is a schematic elevation view of a semiconductor device in an interim structure during its manufacture showing detail regarding the occurrence of punchthrough during manufacture. In FIG. 10, an example of how an improperly applied etch step can interfere with reliable production of a semiconductor device is illustrated: the phenomenon of "punchthrough". Punchthrough occurs when a material is removed substantially completely in an area, thereby exposing an underlying material. The circumstance illustrated in FIG. 10 is an occasion where an interim semiconductor device 90 has a polysilicon layer 102 that has been removed to a greater degree adjacent walls 103, 105 than removal has occurred at loci distal from walls 103, 105. If such a structure is presented for a subsequent etch step, the etch recipe/plan for the semiconductor device may take into account thickness $d_2$ at loci distal from walls 103, 105 but not account for a lesser thickness $d_3$ than the expected thickness $d_1$ (FIG. 9). As a consequence, a subsequent etch step may cause punchthrough near walls 103, 105 due to a prolonged exposure of oxide layer 93 to the PEP step.

Figure 11:
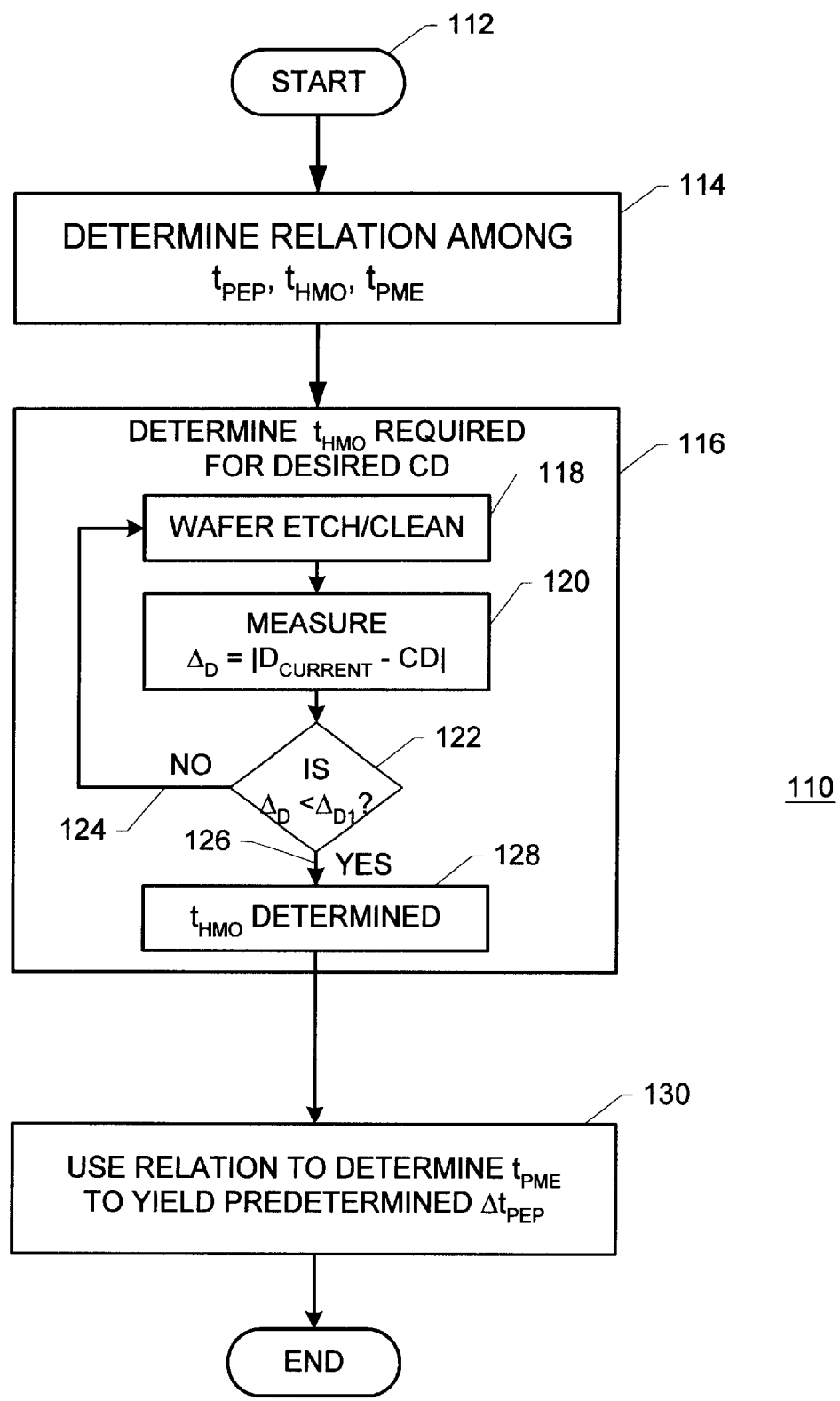
FIG. 11 is a flow diagram illustrating a preferred embodiment of the present invention.

FIG. 11 is a flow diagram illustrating a preferred embodiment of the present invention. In FIG. 11, a method 110 for dynamically controlling a semiconductor manufacturing process that produces a semiconductor component by performing a plurality of process segments. In particular, FIG. 11 illustrates the present invention in an exemplary situation dynamically controlling a semiconductor etch process that includes a plurality of etch segments, or steps. Each respective process segment of the plurality of process segments in FIG. 11 is performed for a respective processing interval. Method 110 begins at a start locus 112 and proceeds to determining a relationship among respective process intervals for at least two particular process segments of the plurality of process segments, as indicated by a block 114.

The relationship may be reduced to an equation form or it may be expressed in empirical terms or in graphical terms such as in a curve. The relationship may be stored on-line or off-line in any of various formats appropriate for its use in practicing the invention. By way of example and not limitation, the relationship may be stored as a table amenable for use as a look up table or otherwise employed, the relationship may be stored in the form of a matix or matrices, the relationship may be stored as an equation or in another form or format.

In the exemplary embodiment of the invention illustrated in FIG. 11, a determination is made of the relationship among processing times or intervals for polysilicon end point etch ($t_{PEP}$), hard mask over etch ($t_{HMO}$) and polysilicon main etch ($t_{PME}$). By way of example, the value of HMO processing interval $t_{HMO}$ is determined as follows. First, a relationship between the CD (critical dimension) loss and HMO processing interval $t_{HMO}$ is determined empirically by processing several pilot wafers. Then the pre-etch CD of a test wafer from the lot is measured, and the required CD loss to reach the final CD is calcuated. After that the test wafer is etched by using HMO processing interval $t_{HMO}$ determined from the empirically established CD loss versus $t_{HMO}$ relationship, often expressed in a gaphic curve. The test wafer is cleaned and the post etch CDs are measured.

By way of further example, PME process interval $t_{PME}$ is determined in the following way. First, a number of pilot wafers are etched with different HMO processing interval $t_{HMO}$ values and PEP processing interval $t_{PEP}$ is determined by monitoring the OES signal (optical endpoint signal). After that another set of pilot wafers is processed with a fixed typical HMO processing interval $t_{HMO}$ value using various PME processing intervals $t_{PME}$ and again monitoring the OES signal to determine PEP process interval $t_{PEP}$. Then an empirical relationship among the various process intervals $t_{PEP}$, $t_{HMO}$, $t_{PME}$ is established: for example, $t_{HMO}$ versus $t_{PEP}$ and $t_{PME}$ versus $t_{PEP}$.

Method 110 continues with determining a first respective process interval required for a first particular process segment to effect a desired result in the semiconductor component, as indicated by a block 116. In the exemplary embodiment of the invention illustrated in FIG. 11, a process interval $t_{HMO}$ for a hard mask over etch (HMO) is determined for effecting a desired critical dimension (CD) in a gate structure. A wafer etch step is begun, as indicated by a block 118. The difference $\Delta_D$ between the present dimension of the gate $D_{CURRENT}$ and the desired critical dimension (CD) is determined, as indicated by a block 120. As indicated by a query block 122, a query is posed: "Is $\Delta_D$ less than a predetermined value $\Delta_{D1}$?". If the response to the query posed by query block 122 is "NO", then method 110 proceeds according to NO response line 124, and another test wafer is etched (and perhaps cleaned) (block 118). Method 110 continues, measuring of difference $\Delta_D$ of the new test wafer (block 120) and determining whether difference $\Delta_D$ is less than predetermined value $\Delta_{D1}$ (query block 122). If the answer to the query posed by query block 122 is "YES", then method 110 proceeds according to YES response line 126. The HMO process interval $t_{HMO}$ required to effect the desired critical dimension (CD) is determined, as indicated by a block 128.

Method 110 proceeds by using the relationship (or relationships) determined according to block 114 to establish the respective process interval for at least one selected particular process segment in order to fix the respective process interval for a controlled process segment, as indicated by a block 130. In the exemplary embodiment of the invention illustrated in FIG. 11, the relationship (or relationships) determined pursuant to the step indicated by block 114 is employed to determine PME process interval $t_{PME}$ for a polysilicon main etch (PME) in order to establish a predetermined PEP process interval $t_{PEP}$ for the polysilicon end point etch (PEP). Once the HMO process interval $t_{HMO}$ is determined (block 128), relationships determined pursuant to block 114 are employed to determine PME process interval $t_{PME}$. The HMO process interval $t_{HMO}$ value is used to determine PEP process interval $t_{PEP}$. The PME process interval $t_{PME}$ versus PEP process interval $t_{PEP}$ relationship is used to calculate what PME process interval $t_{PME}$ should be used. However, to bring PEP process interval $t_{PEP}$ to the desired value, the calculated $_{PME}$ process interval $t_{PME}$ value must be adjusted by using the empirically established $$\frac{\Delta t_{PME}}{\Delta t_{PEP}} \text{ (block 114).}$$

The preferred embodiment of the method of the present invention permits adjustment of HMO process interval $t_{HMO}$ for a hard mask over etch (HMO) step and PME process interval $t_{PME}$ for a polysilicon main etch (PME) step in an etch process to fix the PEP process interval $t_{PEP}$ for a polysilicon end point etch (PEP) step in the etch process. Preferably PEP process interval $t_{PEP}$ is established as a constant interval for the various lots processed using the etch process, and preferably PEP process interval $t_{PEP}$ is established having as short a duration as possible. The short duration provides several advantages. First, the PEP etch step is typically carried out in a chamber containing a non-fluoride atmosphere. As a consequence, a PEP etch step commonly causes deposition of material on the walls of the chamber as well as on tools and other equipment contained within the chamber during the PEP etch step. Eventually, if no chamber cleaning is effected to remove the deposited material, impurities involving deposited material can drop upon tools and wafers during processing. Such unwanted depositions can cause a yield problem for the etch process. Thus, reducing the time spent in the etch process during which such deposits occur reduces the amount of deposition that collects on the walls and tools. Better quality control results. Further, less frequent cleaning of the chamber and tools is required, thus providing a further contribution to better yields and improved throughput for the etch process.

Another advantage provided by employing the present invention in semiconductor manufacturing etch processing is that PEP etch processes typically affect n-type material differently than they affect p-type material. In contrast, PME etch processing commonly treats n-type material and p-type material substantially the same. By adjusting PME process interval $t_{PME}$ to keep PEP process interval $t_{PEP}$ as short as possible, the treatment of n-type materials and p-type materials will not be substantially different from device to device. This equal treatment of different materials results in greater predictability and uniformity of critical dimensions (CD), such as gate dimensions, in variously constructed semiconductor devices that may be situated in a semiconductor device being produced.

Keeping PEP process interval $t_{PEP}$ constant reduces the likelihood of the occurrence of punchthrough, so that POE process interval $t_{POE}$ for effecting a polysilicon over etch (POE) etch step can be reliably and accurately determined.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for dynamically controlling a semiconductor manufacturing process; said process producing a semiconductor component by performing a plurality of process segments; each respective process segment of said plurality of process segments being performed for a respective processing interval; the method comprising the steps of:
    (a) determining a relationship among respective process intervals for at least two particular process segments of said plurality of process segments;
    (b) determining a first said respective process interval required for a first said particular process segment to effect a desired result in said semiconductor component; and
    (c) using said relationship to establish said respective process interval required for at least one selected said particular process segment in order to fix said respective process interval for a controlled process segment; said controlled process segment being another said particular process segment than said at least one selected particular process segment.

2. A method for dynamically controlling a semiconductor manufacturing process as recited in claim 1 wherein said desired result is establishment of a predetermined critical dimension in said semiconductor component.

3. A method for dynamically controlling a semiconductor manufacturing process as recited in claim 1 wherein said relationship is expressed in terms relating said respective process interval for said controlled process segment as a function of respective process intervals for said at least two particular process segments other than said controlled process segment.

4. A method for dynamically controlling a semiconductor manufacturing process as recited in claim 2 wherein said relationship is expressed in terms relating said respective process interval for said controlled process segment as a function of respective process intervals for said at least two particular process segments other than said controlled process segment.

5. A method for dynamically controlling manufacture of a semiconductor device; said manufacture including a plurality of etch process steps; each respective etch step of said plurality of etch steps being performed for a respective etch interval; the method comprising the steps of:

(a) ascertaining a relationship among three specific etch intervals of said plurality of etch intervals;

(b) determine a first said respective etch interval required for a first said specific etch interval to effect a predetermined result in said semiconductor device;

(c) using said relationship to determine said respective etch interval for a second said specific etch interval of said three specific etch intervals in order to fix a third said specific etch interval of said three specific etch intervals.

6. A method for dynamically controlling manufacture of a semiconductor device as recited in claim 5 wherein said predetermined result is establishment of a critical dimension in said semiconductor component.

7. A method for dynamically controlling manufacture of a semiconductor device as recited in claim 5 wherein said relationship is expressed in terms relating said third specific etch interval as a function of said first specific etch interval and said second specific etch interval.

8. A method for dynamically controlling manufacture of a semiconductor device as recited in claim 7 wherein said relationship is expressed in terms relating said third specific etch interval as a function of said first specific etch interval and said second specific etch interval.

9. An apparatus for effecting a plurality of communication connections between at least two switching devices in a communication system as recited in claim 8 wherein at least one of said first router interface device and said second router interface device comprises a plurality of router selection devices; each respective router selection device of said plurality of router selection devices affecting at least one respective selected communication connection of said plurality of communication connections.

10. A method for dynamically controlling a process for manufacturing a semiconductor device; said process including a plurality of process segments; each respective process segment of said plurality of process segments being performed for a respective processing interval; the method comprising the steps of:

(a) determining a relationship among three specific processing intervals for three specific process segments of said plurality of process segments;

(b) performing a first said specific process segment for a first processing interval; said first processing interval being established when a predetermined result is achieved in said semiconductor device;

(c) using said relationship to determine a second processing interval for a second said specific process segment of said three specific process segments; said second processing interval being established appropriately to fix a third processing interval for said third specific processing segment; and (d) performing said second specific process segment for said second processing interval.

11. A method for dynamically controlling a process for manufacturing a semiconductor device as recited in claim 10 wherein said predetermined result is establishment of a critical dimension in said semiconductor device.

12. A method for dynamically controlling a process for manufacturing a semiconductor device as recited in claim 10 wherein said relationship is expressed in terms relating said third processing interval as a function of said first processing interval and said second processing interval.

13. A method for dynamically controlling a process for manufacturing a semiconductor device as recited in claim 11 wherein said relationship is expressed in terms relating said third processing interval as a function of said first processing interval and said second processing interval.

\* \* \* \* \*